United States Patent [19]

Liu et al.

[11] Patent Number: 4,857,382

[45] Date of Patent: Aug. 15, 1989

[54] APPARATUS AND METHOD FOR PHOTOETCHING OF POLYIMIDES, POLYCARBONATES AND POLYETHERIMIDES

[75] Inventors: Yung S. Liu; Willard T. Grubb, both of Schenectady, N.Y.

[73] Assignee: General Electric Company, Schenectady, N.Y.

[21] Appl. No.: 186,254

[22] Filed: Apr. 26, 1988

[51] Int. Cl.[4] .......................... B44C 1/22; B29C 37/00
[52] U.S. Cl. ..................................... 428/156; 156/643; 156/646; 156/655; 156/659.1; 156/668; 156/345; 428/412; 428/473.5
[58] Field of Search ............ 156/643, 646, 655, 659.1, 156/668, 345; 428/156, 170, 412, 458, 473.5

[56] References Cited

U.S. PATENT DOCUMENTS

| | | | |
|---|---|---|---|
| 3,664,899 | 5/1972 | Wright et al. | 156/8 |
| 3,961,099 | 6/1976 | Gipstein et al. | 427/43.1 X |
| 4,379,180 | 4/1983 | Baglin et al. | 156/668 X |
| 4,414,059 | 11/1983 | Blum et al. | 156/668 X |
| 4,417,948 | 11/1983 | Mayne-Banton et al. | 156/643 |
| 4,424,095 | 1/1984 | Frisch et al. | 156/902 X |
| 4,568,632 | 2/1986 | Blum et al. | 427/54.1 X |
| 4,617,085 | 10/1986 | Cole, Jr. et al. | 156/643 |
| 4,749,436 | 6/1988 | Minato et al. | 427/54.1 X |

OTHER PUBLICATIONS

Bjorkholm, J. E. et al., "Direct Writing in Self-Developing Resists Using Low-Power CW Ultraviolet Light", *Journal of Applied Physics*, vol. 58 (6), 9/15/85, pp. 2098-2100.

Johnson, P. D., "Excitation of Hg+ 1942 Å in the High-Current-Low-Pressure Discharge", *Applied Physics Letters*, vol. 18, No. 9, May 1, 1971, pp. 381-382.

van Pelt, Pieter, "Processing of Deep-Ultraviolet (UV) Resists", SPIE, vol. 275, Semiconductor Microlithography VI, 1981, pp. 150-154.

*Primary Examiner*—William A. Powell
*Attorney, Agent, or Firm*—Robert Ochis; James C. Davis, Jr.; Marvin Snyder

[57] ABSTRACT

Polyimides, polycarbonates, polyetherimides and other highly stable organic polymers are photoetched through the use of deep ultraviolet light produced by a broad area, non-coherent, continuous light source. This method is effective in an oxygen-free environment, but provides slightly higher etch rates in an air ambient as a result of the oxygen in the air ambient. The apparatus in which this photoetching occurs may employ a single light source or a plurality of side-by-side lamps and may include ports which allow continuous transport of samples therethrough.

24 Claims, 7 Drawing Sheets

APPARATUS AND METHOD FOR PHOTOETCHING OF POLYIMIDES, POLYCARBONATES AND POLYETHERIMIDES

BACKGROUND OF THE INVENTION

The invention relates to the field of etching organic polymers and more particularly, to the field of etching organic polymers with the aid of ultraviolet radiation.

PRIOR ART

Organic polymers have become important materials in many fields and are becoming increasingly important in the electronic arts. For example, polyimides and polyetherimides are applicable to electronic packaging, printed circuit boards and overcoats for VLSI semiconductor structures. Polycarbonates are potentially useful for the fabrication of compact (digital) discs. All three of these polymers have excellent chemical stability, good mechanical strength and processibility. As a consequence of their excellent chemical stability, it is difficult to make patterned layers of these polymers. To achieve their full potential for use in the electronic arts, these polymers must be patternable in an efficient, reliable way which is not deleterious to semiconductor device structures. Therefore, new etching and patterning processes using light sources are needed for these polymers.

Light sources are normally classified as being one of two types: pulsed or continuous. Pulsed sources are generally those whose light production process is incapable of providing continuous radiation. Such sources include pulsed lasers, flash lamps, and so forth. Continuous sources are those which are capable of producing light over a substantial period of time which is limited by failure of the light source rather than being an inherent characteristic of the light generation mechanism. Thus, the term "continuous light sources" does not negate the possibility of that source being operated in a pulsed mode by cycling its applied power and/or through use of a shutter or gate to periodically interrupt transmission of that light to the target. Laser generated light is coherent, typically being of a single frequency and in the form of a narrow beam producing a relatively small spot. The small spot size of lasers makes it difficult to expose large areas to a particular range of wavelengths of light. The light emanating from a filament lamp or a gas discharge lamp is non-coherent, generally covers a broad area (normally almost a full sphere unless a reflector or other collimation means is employed) and includes a range of frequencies.

There is a lack of universal agreement on what constitutes the longest wavelength of ultraviolet light. For the purpose of this specification, ultraviolet light is defined as having wavelengths under 400 nanometers (nm).

It is known in the art to use ultraviolet light in combination with oxygen or ozone to remove organic films such as polymethylmethacrylate (PMMA) from substrates after they have been selectively etched in a pattern determined by the PMMA. The reaction rate of the oxygen with the film is accelerated by the energy added to the reacting materials by the ultraviolet light and by the conversion of some of the oxygen to a more reactive form as ozone. Ablative photodecomposition of PMMA is disclosed in U.S. Pat. No. 4,414,059 which teaches that ablative decomposition is only effective for energy fluence above a critical threshold of approximately 10–15 mJ/cm$^2$ per 10 nanosecond pulse. Such high energy levels in combination with the small spot size of the laser utilized in U.S. Pat. No. 4,414,059 result in substantial local heating of the organic film which appears to induce thermal decomposition of the film. This ablative process does not require the presence of oxygen for its success since the ablative decomposition is a result of internal heating of the film rather than a chemical reaction between the film and reactive species in the environment of the film. However, J.E. Bjorkholm et al. in their article entitled "Direct Writing in Self-Developing Resists Using Low-Power CW Ultraviolet Light", *Journal of Applied Physics*, Vol. 58, No. 6, Sept. 15, 1985, pp. 2098–2101, which is incorporated herein by reference in its entirety, report that in the absence of oxygen, this etching process is self-limiting due to photo-induced cross linking of PMMA at the bottom of a groove which is formed by ablative decomposition. That work was done with 3mW of laser light at 257.2 nm having a spot size of 1.4 microns. Bjorkholm et al. state that they observed no energy density or intensity thresholds for the initiation of ablation and that the depth of the ablated groove was determined by the deposited energy density, independent of the deposition rate. They also state that while all the pulsed observations have reported the existence of a distinct intensity threshold (about $10^6$ W/cm$^2$ for pulse lengths of about 10 ns), their work was carried out with much lower intensities (about $10^4$ W/cm$^2$), but higher exposures and speculated that different physical mechanisms are responsible for ablation in cw and pulsed conditions.

Because the lasers which are used for etching organic films have very small spot sizes (on the order of a few microns), such a process carries with it the disadvantage, when large areas are to be etched, of a need to sweep the laser across the entire film area to be etched, with very small increments between sweeps, in order to expose the entire area of the film to be removed to sufficient energy for its ablative photodecomposition.

Polycarbonates, polyimides and polyetherimides are extremely stable thermoplastics which are even stable in the presence of UV light. In order for these polymers to achieve their full potential, techniques for etching and patterning them are needed.

In removing large areas of an organic film or relatively thin portions of an organic film, it would be beneficial to employ a technique which does not involve a critical energy threshold and which inherently provides the active light over a large area.

An object of the present invention is to provide an etching technique for polyimides, polycarbonates and polyetherimides which is suitable for large area etching.

Another object is to provide a dry etching technique for use with polyimides, polycarbonates and polyetherimides.

Still another object is to provide a technique for rapidly photoetching relatively large areas of polyimides, polycarbonates and polyetherimides.

A further object is to provide a polymer etching process which does not have an energy threshold for the initiation of etching.

A still further object is to provide a polymer etching process in which the etching rate is controllable A still further object is to provide a photoetching technique for use with polyimides, polycarbonates and polyetherimides which does not require the presence of oxidizing species in order to provide a useful etching rate. (The term "oxidizing species" is intended to include molecules, ions, radicals and other forms of matter which are capable of oxidizing the material being discussed, prepared or treated or components thereof.)

SUMMARY OF THE INVENTION

In accordance with the present invention, polyimides, polycarbonates and polyetherimides are photodecomposed by exposure to continuous illumination from an ultraviolet light source in which at least 10% of the light energy emitted by that source has a wavelength of less than 200 nanometers. The etching process can be accelerated by the presence of oxidizing species in the ambient environment of the film, but such oxidizing species are not necessary. The physical process in this etching is believed to be direct photodecomposition of the polymer material rather than thermal decomposition.

A photoetching apparatus in accordance with the invention comprises a high-current-density, non-coherent mercury lamp which provides high intensity ultraviolet light at wavelengths of less than 200 nm. The apparatus allows the etching rate to be controlled by adjusting the current density in the lamp and the lamp-to-sample distance.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
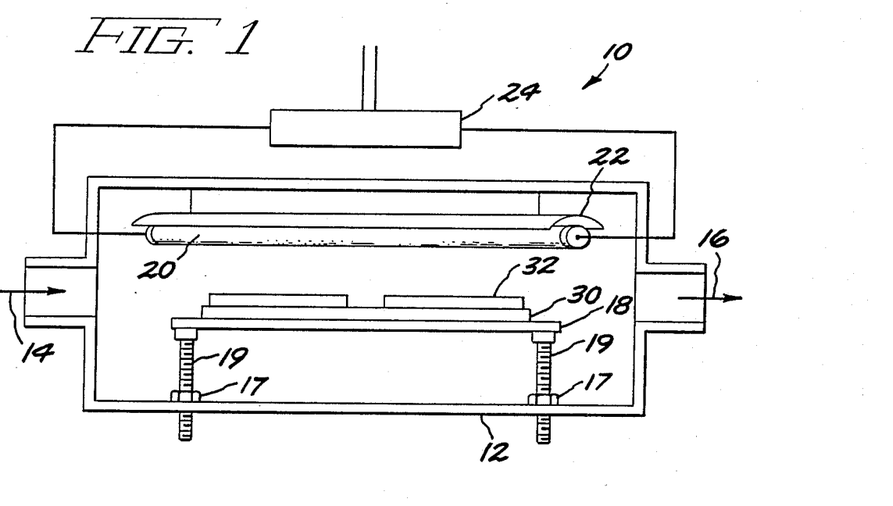
FIGS. 1 and 2 are schematic illustrations of etching apparatus in accordance with one embodiment of the present invention.
Figure 2:
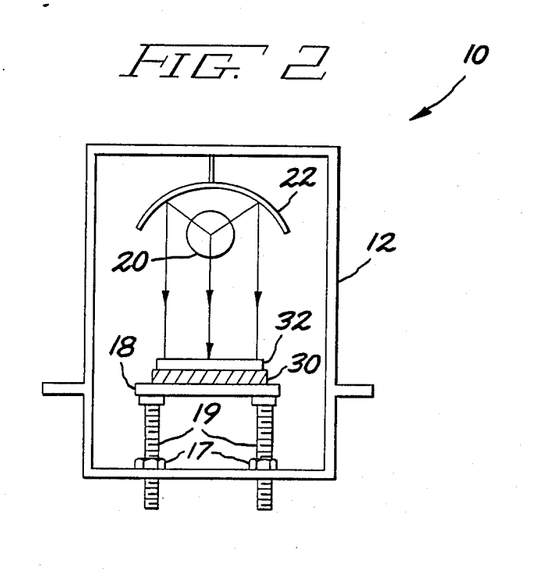

An etching apparatus 10 suitable for carrying out the present invention is illustrated schematically in FIGS. 1 and 2. FIG. 1 represents a side view and FIG. 2 an end view. This etching system comprises a housing or enclosure 12 which is substantially airtight except for a flushing gas inlet port 14 and a flushing gas outlet port 16. The flushing gas inlet and outlet ports are provided in order that the ambient atmosphere may be controlled and etching products may be removed. Suitable atmospheres discussed hereinafter are air or nitrogen gas, preferably at atmospheric pressure for simplicity of operation, although other higher or lower pressures may be used if desired, including reduced pressures down to and including vacuums of less than 1.0 torr.

A sample support structure 18 is disposed within enclosure 12 for supporting a sample 30 to be etched. The legs 19 of support structure 18 are adjustable to enable the spacing of the sample 30 from lamp 20 to be adjusted. One means of adjusting this spacing is by utilizing threaded legs 19 with nuts 17, as shown. Many other adjustment means, such as hydraulic, pneumatic or mechanical adjustable clamps, may be used instead. Also included within the housing and situated directly above the sample support member 18 is an ultraviolet lamp 20 and reflector 22 for concentrating the light emitted by the lamp onto the sample. The lamp is powered through a lamp ballast 24 which is shown outside the enclosure.

The lamp 20 is preferably a high-current-density mercury lamp whose envelope is transparent to ultraviolet light at least down to below 180 nanometers wavelength and preferably much lower. The lamp used in these experiments was discussed by P.D. Johnson in the *Applied Physics Letters*, Volume 18, No. 9, (1971) at page 381 in an article entitled "Excitation of Hg 1942 Å In The High-Current-Low-Pressure Discharge". That article is incorporated herein by reference in its entirety for its teaching of lamp construction, operation and emission spectrum. The lamp used in these etching experiments is not considered to be critical, as long as it provides a high fluence of ultraviolet light, particularly at wavelengths of less than 200 nanometers in order to obtain a high etching rate. The above-described lamp is considered a preferred lamp at this time because of its relatively high intensity of short wavelength ultraviolet light and because the intensity of the deep ultraviolet (under 200 nanometers) increases with increasing current density in the lamp. This lamp produces non-coherent illumination.

In the experiments detailed later in this specification, the lamp 20 had an internal diameter of 10 millimeters and an overall length of 30 millimeters. The envelope was made of Suprasil UV transmitting quartz. In order to produce high intensity ultraviolet light at the 194 nanometer line of mercury, this lamp should be operated at a high current density, preferably greater than 1.0 amps/cm$^2$. In the experiments detailed hereafter, the lamp was operated at a current density of 1.6 amps/cm$^2$. We consider it preferable to operate this lamp at a current density which causes more than 10% of the emitted light energy to have a wavelength of less than 200 nanometers. In our work, an energy fluence of about 0.1 to 1 watt/cm$^2$ is provided by this light source. This is orders of magnitude lower than the reported prior art work on the etching of PMMA.

Figure 3:
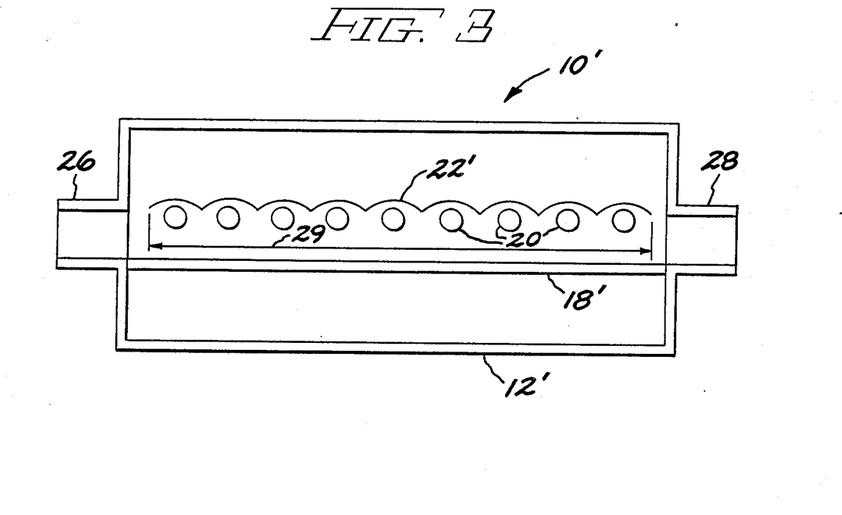
FIGS. 3 and 4 are schematic illustrations of alternative embodiments of the etching apparatus.

An alternative embodiment of etching apparatus in accordance with the invention is shown generally at 10' in FIG. 3. The housing 12' in FIG. 3 includes input and output ports 26 and 28 through which a continuous line of samples to be etched may enter and exit the enclosure. In those situations in which the desired ambient during etching is other than air, the ports 26 and 28 preferably include means for providing a gas curtain to prevent mixing of the external ambient atmosphere with the temperature within the chamber 12'. The sample support 18' of housing 12' is suitable for supporting the samples during transport through the enclosure. Samples may also be separately (individually inserted rather than being passed through as a continuous or connected series. The enclosure 12' includes a plurality of lamps 20 each of which, as shown in FIG. 2, is oriented with its cylindrical axis perpendicular to the plane of the paper. The reflector 22' is preferably configured to serve as a reflector for all of the lamps, concentrates their ultraviolet emissions on the samples being treated and, to the extent possible, renders the ultraviolet fluence on the sample uniform throughout the lamp zone 29 of the enclosure.

Figure 4:
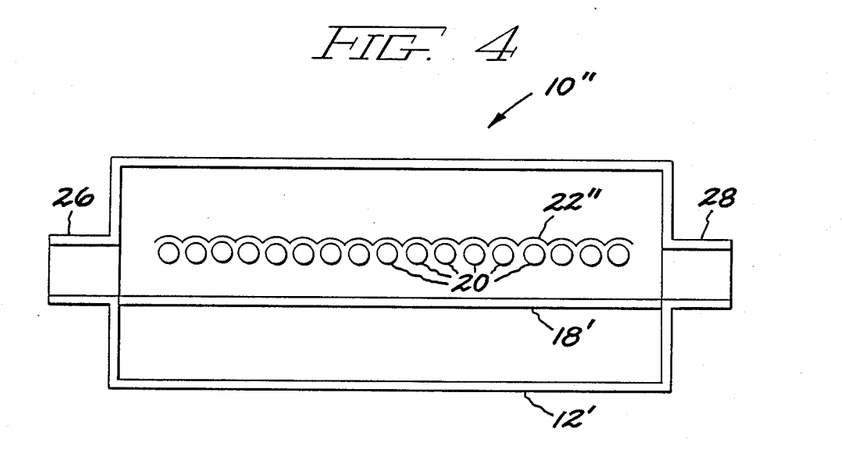

A further alternative embodiment of etching apparatus in accordance wtih the invention is shown at 10" in FIG. 4. The only difference between the systems 10' and 10" is in the number and spacing of the lamps 20 and in the shape of the reflector. As a result of the lamps being closer together, the reflector 22" in FIG. 4 is made with its scallops or individual curvatures having a shorter physical period than those of the reflector 22'. In system 10", the lamps 20 are placed close enough together to provide a substantially uniform illumination of a sample as it passes through the enclosure or is stationary under the lamps. This is due to overlap of the illumination from adjacent lamps in a manner in which each lamp compensates for the fall-off in intensity of the light from its adjacent lamp with increasing distance from the lamps in the space between the adjacent lamps. With proper selection of the spacing between adjacent lamps, the separation of the row of lamps from the sample, and proper design of the reflector, a substantially uniform ultraviolet intensity can be provided over the sample. The design of such a lamp and reflector system is dependent on the lamp illumination characteristics, but is within the skill in the art once the lamp's characteristics are known. In order for the sample to undergo uniform exposure, the lamps should be longer than the width of the sample so that there is no fall-off in intensity at the widthwise edges of the sample. For a system in which samples will move through the lamp zone at a uniform rate, uniform lamp intensity in the direction of travel is not necessary since the intensity integrated for the entire transit of the lamp zone will be the same for each spot on the sample.

As shown in FIG. 1, a mask 32 is applied to the sample 30 in order to restrict etching to selected (i.e. unmasked) portions of the sample 30. It will be recognized that the mask may be spaced from the sample and still be effective for shadowing the sample. However, because of the non-collimated nature of the light emitted by the lamp, it is preferred that the mask be placed in contact with, or be barely spaced from, the sample. Direct contact is particularly desirable for continuous feed situations.

In accordance with the invention, the polymeric sample to be etched is preferably polyimide, polycarbonate or polyetherimides.

EXAMPLES

Figure 5A:
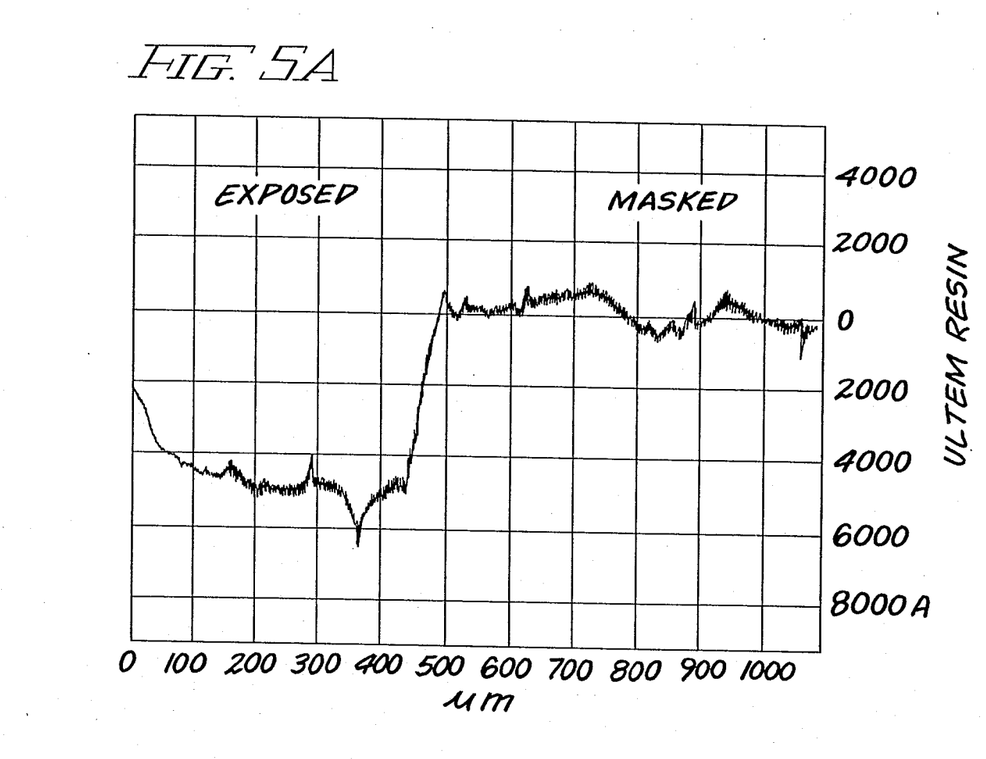
FIGS. 5A, 5B and 5C illustrate film profiles in the vicinity of the edge of a mask following etching in accordance with the present invention.

As a first example of operation of the invention, a sample of ULTEM (a registered trademark of General Electric Company) polyetherimide resin was etched. The sample in the form of a sheet was placed inside enclosure 12 on support 18, as shown in FIG. 1, at a distance of about 2 centimeters from the lamp 20. The gas in the enclosure was air. The lamp was operated at a current density of 1.6 amps/cm$^2$ for a period of six hours. A simple mask of UV blocking materials in the form of a rectangle disposed in contact with the sample was used to protect part of the sample. After six hours of exposure to radiation from the lamp, a surface profile meter was used to measure the profile of the sample. The profile of this sample is shown in FIG. 5A. As can be seen, the ULTEM resin was etched to a depth of about 5,000 angstroms for an average etching rate of about 770 angstroms/hour.

Figure 5B:
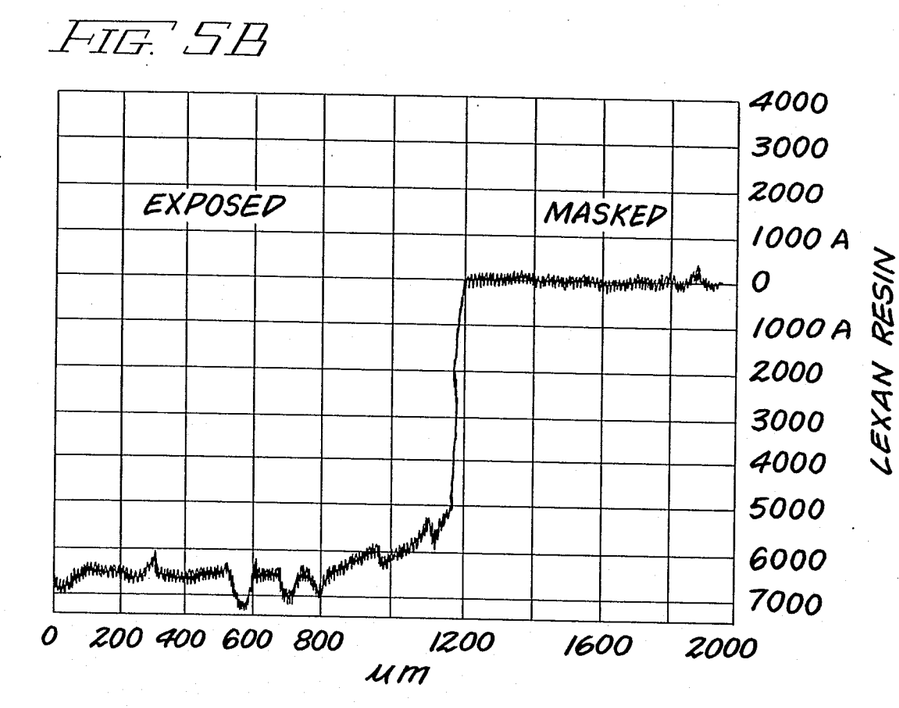

As a second example, a sample of LEXAN (a registered trademark of General Electric Company) polycarbonate resin was etched. The sample, which was in the form of a sheet 2 millimeters thick, was placed inside enclosure 12 on support 18, as shown in FIG. 1 with a mask of UV blocking materials disposed in contact with the sample. Again, the gas in the enclosure was air and the sample was about 2 centimeters from the lamp and exposed to radiation from the lamp for six hours. The profile of the LEXAN resin as measured using a surface profile meter at the end of this six hour period is shown in FIG. 5B. As can be seen, the average depth of the etched region was slightly more than 6,000 angstroms for an etch rate of about 1,000 angstroms/hour.

Figure 5C:
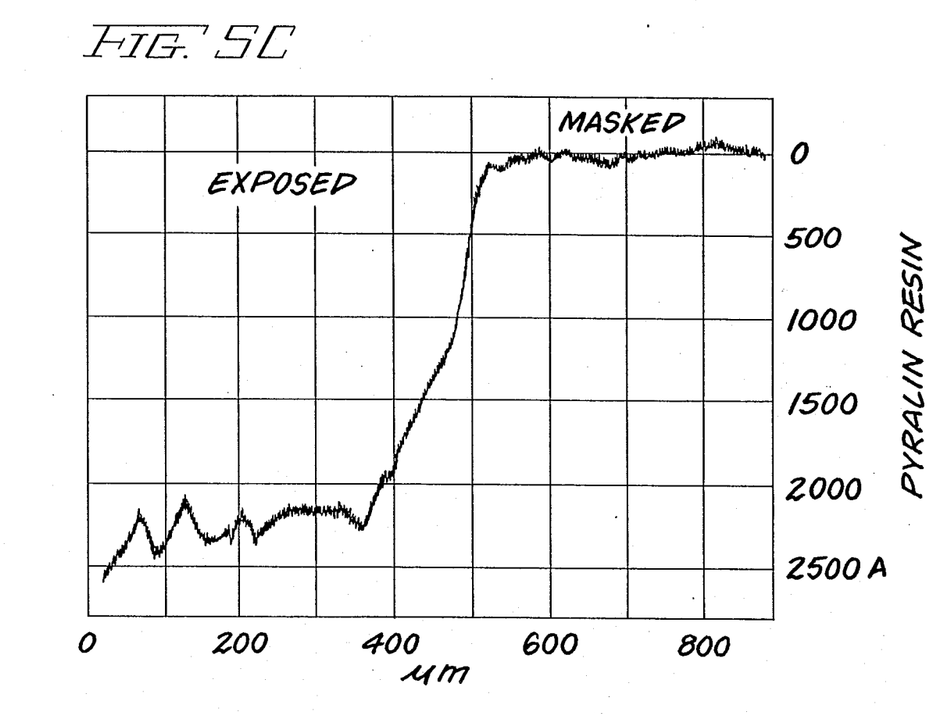

As a third example, a sheet of Pyralin (a trademark of E.I. DuPont de Nemours Co.) polyimide, about 0.05 millimeters thick was placed inside enclosure 12 on support 18, as shown in FIG. 1 with the mask in contact with the sample. Again, the sample was about 2 centimeters from the lamp, the gas in the enclosure was air and the sample was exposed to the ultraviolet light for six hours. The surface contour of the sheet as measured using the surface profile meter at the end of the exposure period is shown in FIG. 5C. As can be seen, the depth of the etched area was between 2,000 and 2,500 angstroms, which yields an average etch rate of about 350 angstroms/hour.

Figure 6:
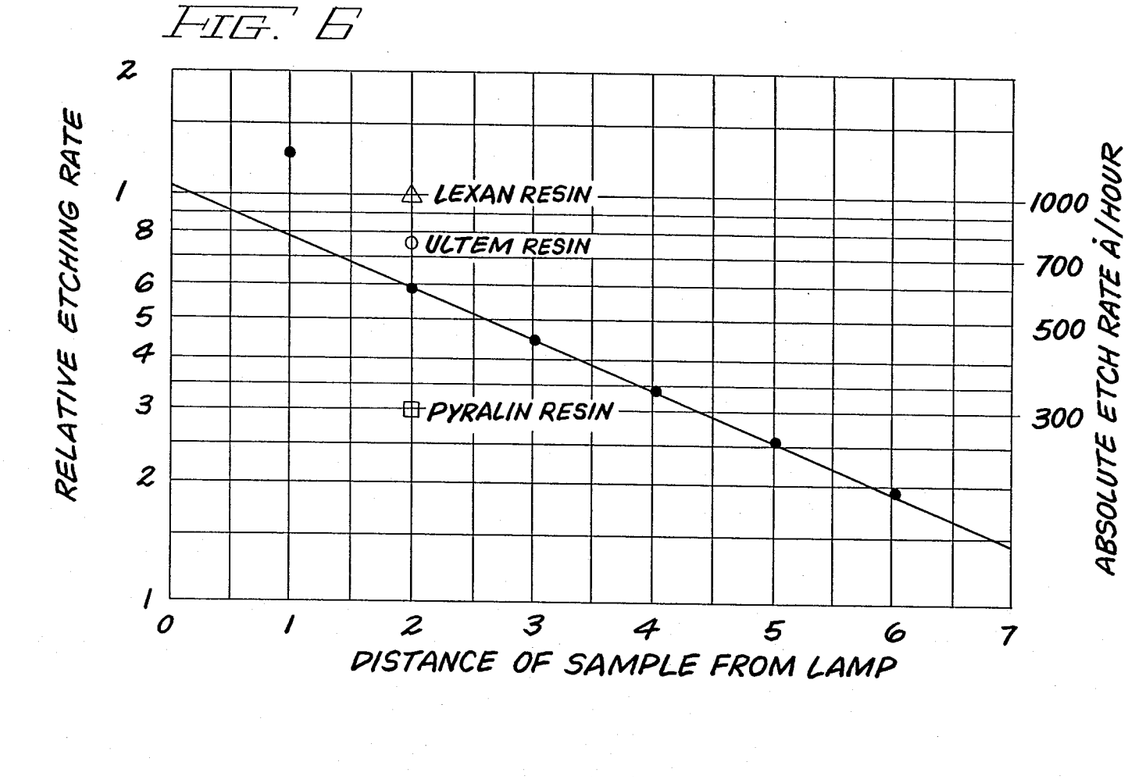
FIG. 6 is a graph showing the etch rate of a polymeric sample as a function of the separation between the lamp and the sample.

In order to control the etching rate, the following experiments were performed: Pyralin polyimide samples were prepared on the sample substrate of a quartz crystal oscillator used as a sensor in a quartz thin film monitor or microbalance. The oscillator frequency which is a function of the weight of the film, was monitored and thus the etching rate was determined at a given spacing between the sample and the lamp. The experiments were repeated at various spacings and the results are plotted in FIG. 6. As shown in FIG. 6, the relative etching rates for the samples for spacings of 2, 3, 4, 5 and 6 centimeters fall essentially on a straight line on this semi-logrithmic graph. The slope of this line is less than 1 with the result that the etch rate varies with distance D from the lamp as the function $D^{-a}$ where "a" is a constant which is less than 1. It will be noted that the sample for 1 centimeter falls substantially above this straight line. We are not certain whether this is a result of an error in spacing the sample from the lamp, is merely a measurement error or reflects some other process such as heating which accelerates the etch rate closer to the lamp. It is thought, however, to be a result of heating of the sample as a result of its close proximity to the lamp, since the etch rate is higher at higher temperatures. No mask was used and etching took place over the entire upper surface of the sample. This curve is plotted for relative etch rates (lefthand scale) and not absolute etch rates since the data was taken by microbalance weight measurements rather than by the surface profile meter depth-of-etch measurements on a sample which was partially masked. For comparison, in FIG. 6, the absolute etch rates in angstroms per hours for ULTEM resin, Lexan resin and Pyralin resin are plotted against the righthand scale for a distance between the lamp and samples of 2 cm.

Figure 7:
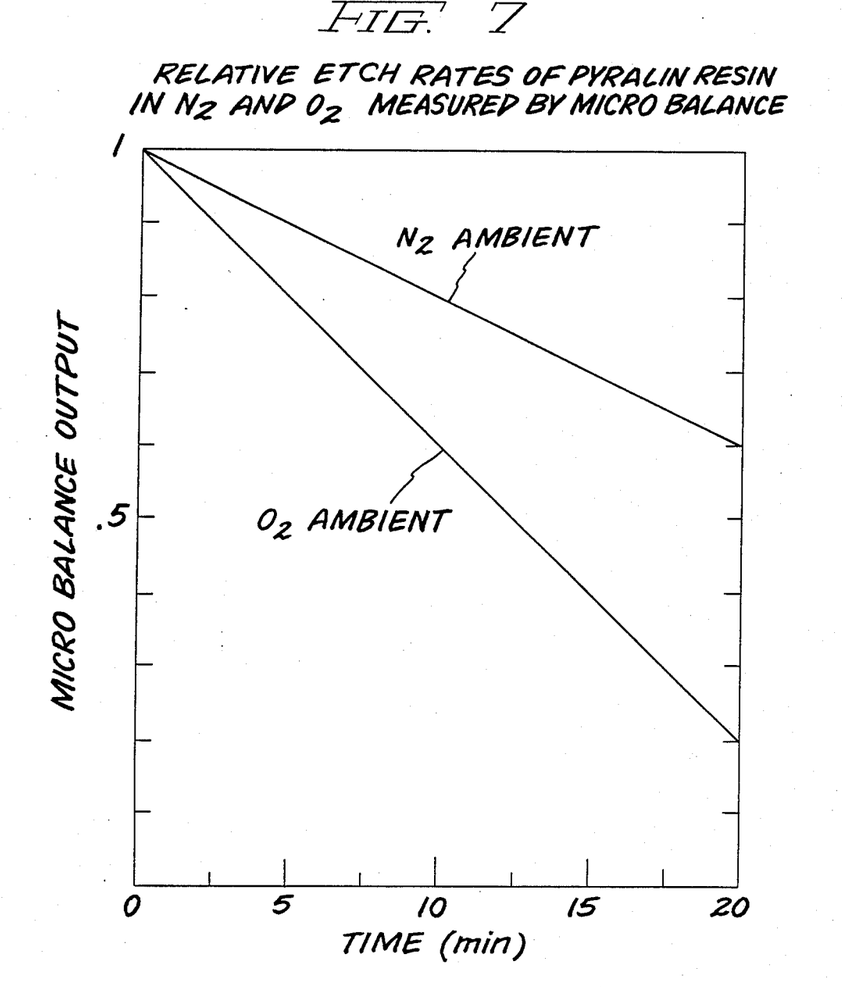
FIG. 7 is a graph showing etching rates of a polyimide in nitrogen and oxygen as measured by microbalance.

In order to determine the effect of the presence of oxygen on the etching rate, relative etch rate measurements for a Pyralin polyimide sample were made in both a nitrogen atmosphere and in an air (i.e. oxygen-containing) atmosphere. Measurement of the etch rate was again made by using a microbalance to determine weight loss of the sample. It is found that the etch rate in an oxygen ambient is about two times the etch rate in the nitrogen ambient. Since there is no known reaction between nitrogen gas and polyimide, it is believed that the etch rate for the sample in nitrogen results from etching caused solely by ultraviolet light and the faster etch rate which occurs in the presence of the oxygen in an air ambient reflects a slight acceleration of that ultraviolet-light-only etching rate caused by the presence of oxygen which accelerate the etching either by reacting with the polymer in a way which accelerates the breaking of the chemical bonds within the polymer or by reacting with the decomposition products of the polymer which results in the decomposition products being removed from the etching are more rapidly so as to increase the effective exposure of the sample to the ultraviolet light. The etch rate in a vacuum should be similar to that in nitrogen. Microbalance traces reflecting the etch rates in oxygen and nitrogen are shown in FIG. 7.

On the basis of the experiments which have been performed, it is believed that there is no inherent energy level threshold for the photodecomposition process involved in the present invention. This is in direct contrast to the prior art pulsed ablative techniques which are dependent on exceeding an ablation threshold energy in order to etch the organic film. The etch rate in accordance with the invention increases with increases in the intensity of the ultraviolet light, but is most pronounced for increases in the intensity of ultraviolet light at a wavelength shorter than 200 nanometers. For several reasons, the physical process in the inventive etching technique is believed to be direct photodecomposition of the polymer material rather than the thermal decomposition which is produced in the laser ablative decomposition process or the chemical decomposition in oxidative ultraviolet environments. First, the inventive process has not shown any threshold intensity below which etching ceases. This is in direct contrast to the ablative laser processes in which a minimum energy level per pulse is necessary in order for the etching to occur. Further, while the ablative process induces significant localized temperature increases, the light intensity from the source in our experiments can be expected to produce a temperature rise of at most a few degrees in our test polymer substrates. Thus, the temperature rise induced by the inventive process does not reach the level produced by the threshold value in the ablative decomposition of the substantially less stable PMMA. Third, the fact that our process will proceed in the absence of oxidizing species indicates that a direct decomposition is occurring as opposed to a photoaccelerated reaction as is the case in the presence of oxygen or ozone in the prior art longer wavelength ultraviolet/oxidation etching systems. The fact that the addition of oxygen or ozone increases the etch rate is consistent with this conclusion since the two processes, photodecomposition and photoaccelerated chemical reaction, can take place simultaneously in the presence of the oxidizing species. in the case of the ablative decomposition process, the addition of oxygen or ozone also accelerates the process which is indicative of the increased reactivity of the polymer films at high temperatures.

The ability to etch polyimides, polycarbonates and polyetherimides by ultraviolet light exposure in the absence of chemically reactive species is a significant achievement for many uses. For example, these layers can now be more widely used in microelectronics because they can now be selectively etched without the introduction of etchants which may be harmful to the semiconductor and other materials present. Similarly, this technique can be used for patterning the surface of sheets of these polymers for any of the many uses which such materials have when the surface is patterned. Among these uses are preparation of the surface to retain printing inks, paint or other visual contrast materials and so forth. It will be understood that this material may be etched in a continuous fashion through the use of apparatus of the type shown in FIGS. 3 and 4 by passing a sheet of polymer through the etching station in a continuous manner with a mask thereover to induce the desired pattern. As a consequence, the size of the sheet to be treated is dependent only on the size of the etching station and the number and size of the lamps utilized. Where it is desired to etch a sheet which is wider than the length of available lamps, it is possible to utilize adjacent columns of lamps in which the lamps in adjacent columns are offset relative to each other and slightly interleaved in order to provide a uniform illumination across the juncture of the columns.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of etching, by photodecomposition, an organic polymer selected from the group consisting of polyimides, polycarbonates and polyetherimides, comprising:

providing a broad area source of continuous ultraviolet light in the form of a high-current-density mercury lamp operating at a current density of at least 1.0 amp/cm$^2$ of lamp internal cross-sectional area, said ultraviolet light including wavelengths shorter than 200 nanometers; and exposing the portion of said polymer to be etched to the broad area continuous ultraviolet light emanating from said source.

2. A method of etching, by photodecomposition, an organic polymer selected from the group consisting of polyimides, polycarbonates and polyetherimides, comprising:

providing a high-current-density mercury lamp operating at a current density of at least 1.0 amp/cm$^2$ of lamp internal cross-sectional area as a broad area source of continuous ultraviolet light, said ultraviolet light including wavelengths shorter than 200 nanometers;

disposing at least the portion of said polymer to be etched in an environment which is free of molecular oxygen and ozone; and exposing the portion of said polymer to be etched to the broad area continuous ultraviolet light emanating from said lamp.

3. The method recited in claim 2 wherein said environment comprises an inert gas.

4. The method of claim 2 wherein said environment is a vacuum of less than 1.0 torr.

5. The method recited in claim 1 wherein said polymer is disposed in an environment which is free of oxidizing species while it is exposed to said broad area continuous ultraviolet radiation.

6. The method recited in claim 1 wherein:

at least 10% of the light energy emitted by said lamp has a wavelength shorter than 200 nanometers.

7. The method recited in claim 2 wherein said lamp emits a spectrum of ultraviolet light.

8. A method of etching, by photodecomposition, an organic polymer selected from the group consisting of polyimides, polycarbonates and polyetherimides, comprising:
providing a broad area source of continuous ultraviolet light, and ultraviolet light including wavelengths shorter than 200 nanometers;
disposing at least the portion of said polymer to be etched in an environment which is free of molecular oxygen and ozone; and
exposing the portion of said polymer to be etched to the broad area continuous ultraviolet light emanating from said source.

9. The method recited in claim 1 wherein the step of exposing the portion of said polymer to be etched is performed for a controlled period of time.

10. A body of polyimide resin having a surface thereof etched by the method recited in claim 1.

11. A body of polycarbonate resin having a surface thereof etched by the method recited in claim 1.

12. A body of polyetherimide resin having a surface thereof etched by the method recited in claim 1.

13. Etching apparatus for photoetching a sample comprising:
means for supporting said sample;
a high-current-density mercury lamp disposed to illuminate said sample with ultraviolet light; and
control means for operating said lamp at a current density in excess of 1.0 amp/cm$^2$ of lamp internal cross-sectional area.

14. The etching apparatus recited in claim 13 further comprising a housing enclosing said means for supporting said sample and said lamp.

15. The etching apparatus recited in claim 13 wherein said housing includes means for maintaining a predetermined atmosphere within the housing.

16. The etching apparatus recited in claim 15 wherein said means for controlling the atmosphere includes:
an input port; and
an output port;
said housing being substantially airtight in use except for said input and output ports.

17. The etching apparatus recited in claim 16 wherein:
said ports are configured to facilitate gas flow; and
said housing includes means separate from said ports for introduction and removal of samples to be etched.

18. The etching apparatus recited in claim 16 wherein said input and output ports are configured to facilitate transport therethrough of samples to be etched.

19. The etching apparatus recited in claim 18 wherein said input and output ports include means for preventing ambient gases external to said enclosure from entering said enclosure through said ports.

20. The etching apparatus recited in claim 13 further comprising a reflector for concentrating said ultraviolet light emitted by said lamp on said sample.

21. The etching apparatus recited in claim 21 comprising:
a plurality of said high-current-density mercury lamps.

22. The etching apparatus recited in claim 21 further comprising:
a reflector system positioned and configured for causing said lamps to provide a substantially uniform illumination over a sample exposure zone.

23. The method of claim 8 wherein said environment is a vacuum of less than 1.0 torr.

24. The method recited in claim 8 wherein said environment comprises an inert gas.

* * * * *